United States Patent [19]

Terane et al.

[11] Patent Number: 5,051,610

[45] Date of Patent: Sep. 24, 1991

[54] SR LATCH CIRCUIT

[75] Inventors: Hideyuki Terane; Hiroyuki Kawai, both of Itami, Japan

[73] Assignee: Mitsubishi Denki Kabushiki Kaisha, Tokyo, Japan

[21] Appl. No.: 456,335

[22] Filed: Dec. 26, 1989

[30] Foreign Application Priority Data

Feb. 21, 1989 [JP] Japan .................................. 1-42490
Sep. 26, 1989 [JP] Japan ................................. 1-249625

[51] Int. Cl.⁵ ........................ H03K 3/284; H03K 3/26
[52] U.S. Cl. ................................. 307/272.1; 307/443;
307/451; 307/272.3; 307/279
[58] Field of Search ............ 307/443, 448, 451, 272.1,
307/272.3, 279, 291

[56] References Cited

U.S. PATENT DOCUMENTS 3,609,569 7/1970 Todd ................................ 307/272.1

FOREIGN PATENT DOCUMENTS 5236689 12/1978 Japan .................................. 307/279
59-91723 5/1984 Japan .

OTHER PUBLICATIONS

Taub et al., *Digital Integrated Electronics* McGraw-Hill, Inc. 1977.
Introduction to NMOS CMOS VLSI System Design, pp. 81-82 Prentice-Hall.

*Primary Examiner*—Stanley D. Miller
*Assistant Examiner*—Margaret Rose Wambach
*Attorney, Agent, or Firm*—Morrison Law Firm

[57] ABSTRACT

An SR latch is provided, which comprises a D-type latch and a logic circuit connected between data and sense input of the D-type latch and set and reset input terminals of the SR latch circuit. The logic circuit establishes the logic levels of signals applied to the data and sense inputs of the D-type latch such that said SR latch circit can assume one of set, reset and hold states depending on the combination of the logic levels of the signals applied to the set and reset input terminals.

15 Claims, 8 Drawing Sheets

SR LATCH CIRCUIT

This invention relates to an SR (set-reset) latch circuit which can provide complementary outputs even when the logic levels of signals applied to its set (S) and reset (R) input terminals are both "1" (S=R=1), and which can define its state even when the input state changes from the above-stated state to the state S=R=0, and, more particularly, to such an SR latch circuit which consumes very little power.

An SR latch circuit is known well, and typical examples are shown in, for example, *INTRODUCTION TO nMOS & CMOS VLSI System Design*, Prentice-Hall, pages 81-82. A first one of the SR latch circuits shown in this publication comprises two cross-coupled NOR circuits. When S=R=1, its Q and $\overline{Q}$ outputs are both 0 (Q=$\overline{Q}$=0), which means that the complementary relationship of the outputs of this SR latch circuit is broken. When the input state changes from this state to the state S=R=0, the Q and $\overline{Q}$ output states cannot be defined. Accordingly, when it is desired to connect such SR latch circuits in series with each other or with a flip-flop, it is impossible to directly connect them with each other. Therefore, in such an SR latch circuit, the input logic level condition of S=R=1 is inhibited.

In the above-stated publication, another type of SR latch circuit which comprises NAND circuits in place of the NOR circuits is also shown. The operation of this SR latch circuit is substantially the same as that of the first SR latch circuit employing NOR circuits, except that the relationship between the logic levels at the set (S) and reset (R) inputs and the Q and $\overline{Q}$ output states is reversed from that of the first example. Accordingly, this SR latch circuit also has the same disadvantage as the SR latch circuit employing NOR circuits.

Two types of SR latch circuits are disclosed in the official gazette of Japanese Unexamined Patent Publication No. SHO 59-91723, which can provide complementary outputs in response to any combinations of logic levels at their set and reset inputs. The SR latch circuits disclosed in this official gazette use a "1"-level-dominant or "0"-level-dominant wired logic circuit. Wired logic circuits conduct current even in a static condition and, accordingly, their power consumption is large. Therefore they are not suitable for systems powered by batteries of which the capacity is limited.

Accordingly, the object of the present invention is to provide an SR latch circuit and, particularly, a low power consumption SR latch circuit. According to the present invention, the SR latch circuit comprises a conventional synchronous D-type latch (hereinafter referred to simply as D-type latch) and a simple logic circuit connected in the input side of the D-type latch. Regardless of combinations of the logic levels of signals applied to set and reset input terminals, the SR latch circuit of the present invention can provide complementary outputs. More specifically, when S=R=1, the SR latch circuit can assume one of set, reset and hold states. Furthermore, it is advantageously possible to define, without fail, the Q and $\overline{Q}$ output states even when the input states of the circuit change from S=R=1 to S=R=0.

SUMMARY OF THE INVENTION

An SR latch circuit according to the present invention comprises a conventional D-type latch having its Q output connected to a Q output terminal of the SR latch circuit and having its $\overline{Q}$ output connected to a $\overline{Q}$ output terminal of the SR latch circuit, and a logic circuit consuming very little power connected between data and sense inputs of said D-type latch and set and reset input terminals of the SR latch circuit. The logic circuit is arranged to establish the logic levels of signals applied to the data and sense inputs of the D-type latch such that when the set input S=1 and the reset input R=0, the SR latch circuit assumes the set state; when S=0 and R=1, the SR latch circuit assumes the reset state; when S=R=0, the SR latch circuit holds the immediately preceding state; and when S=R=1, the SR latch circuit can assume one of the set, reset and hold states.

BRIEF DESCRIPTION OF THE DRAWINGS

FIG. 2(*a*) is a logic circuit diagram of a first SR latch circuit shown in Japanese Unexamined Patent Publication No. SHO 59-91723;

FIG. 2(*b*) shows a structure in detail of the SR latch circuit of FIG. 2(*a*);

FIG. 3(*a*) is a logic circuit diagram of a second SR latch circuit shown in Japanese Unexamined Patent Publication No. SHO 59-91723;

FIG. 3(*b*) shows a concrete circuit structure of the SR latch circuit of FIG. 3(*a*);

FIG. 4(*a*) is a logic circuit diagram of an SR latch circuit according to a first embodiment of the present invention;

FIG. 4(*b*) shows a concrete circuit structure of the SR latch circuit of FIG. 4(*a*);

FIG. 5(*a*) is a logic circuit diagram of an SR latch circuit according to a second embodiment of the present invention;

FIG. 5(*b*) shows a concrete circuit structure of the SR latch circuit of FIG. 5(*a*);

FIG. 6(*a*) is a logic circuit diagram of an SR latch circuit according to a third embodiment of the present invention;

FIG. 6(*b*) shows a concrete circuit structure of the SR latch circuit of FIG. 6(*b*)

DETAILED DESCRIPTION OF THE INVENTION

Before describing SR latch circuits of the present invention, conventional SR latch circuits are first explained.

Figure 1:
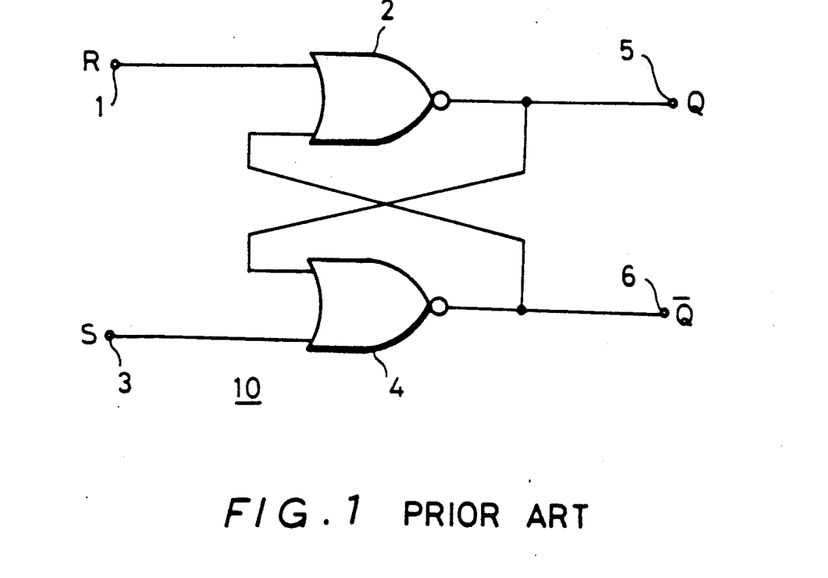
FIG. 1 shows a logic circuit diagram of a conventional SR latch circuit shown in a publication *INTRODUCTION TO nMOS & CMOS VLSI System Design* (Prentice-Hall), pages 81-82.

FIG. 1 illustrates one of conventional SR latch circuits shown in the aforementioned publication *INTRODUCTION TO nMOS & CMOS VLSI System Design*. An SR latch circuit 10 comprises two cross-coupled NOR circuits 2 and 4 with one input of the NOR circuit 2 connected to a reset input terminal 1 of the SR latch circuit 10, and with one input of the NOR circuit 4 connected to a set input 3. The output of the NOR circuit 2 is connected to a Q output terminal 5 of the SR latch circuit, and an output of the NOR circuit 4 is connected to a $\overline{Q}$ output terminal 6.

When a set input S is 1 and a reset input R is 0, the SR latch circuit 10 is in a set state in which a Q output (Q) is 1 and a $\overline{Q}$ output ($\overline{Q}$) is 0. When S=0 and R=1, the SR latch circuit 10 is in a reset state in which Q=0 and $\overline{Q}=1$. Also when $S=R=0$, the SR latch circuit 10 assumes a hold state in which a previous state is held. However, when $S=R=1$, $Q=\overline{Q}=0$ in which the complementary relationship between the outputs is broken. If the input state changes from this state to the state in which $S=R=0$, the Q and $\overline{Q}$ outputs cannot be defined. Therefore, even if such SR latch circuits are to be connected in series, they cannot be directly connected with each other. Accordingly, in this type of SR latch circuit, the use of the input logic level state $S=R=1$ is prohibited.

The above-cited publication shows another type of SR latch circuit which comprises NAND circuits in place of the respective NOR circuits of FIG. 1. The operation of the SR latch circuit comprising NAND circuits is similar to that of the circuit shown in FIG. 1, except that the relationship between the logic levels of the set and reset inputs S and R and the logic levels of the Q and $\overline{Q}$ outputs is reversed with respect to that of the circuit of FIG. 1 which employs NOR circuits. Furthermore, the SR latch circuit using NAND circuits has the same problem as the circuit using NOR circuits.

Figure 2A:
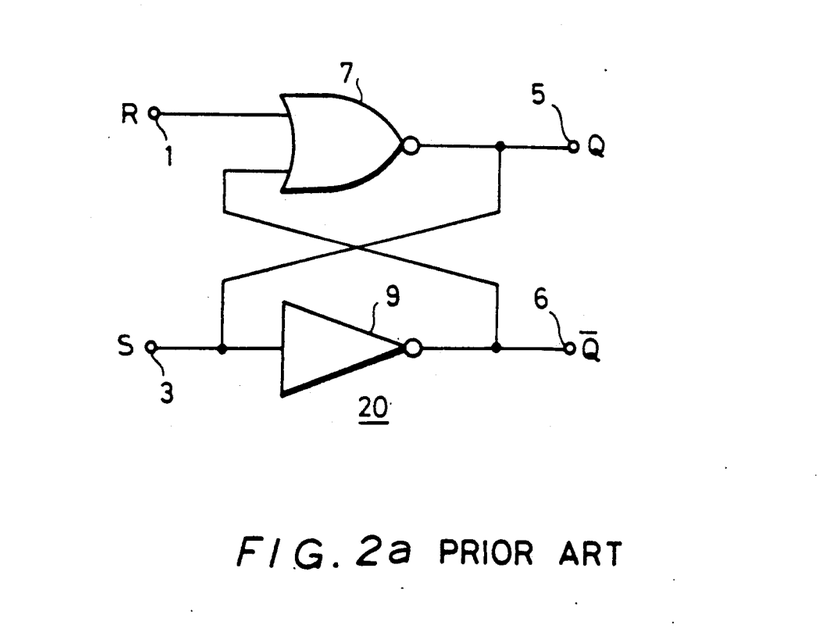

Japanese Unexamined Patent Publication No. SHO 59-91723 mentioned before discloses two types of SR latch circuit which can produce complementary outputs regardless of combinations of the logic levels of the set and reset inputs applied thereto. A first example of the SR latch circuits shown in this Japanese unexamined patent publication is shown in FIG. 2(a). The SR latch circuit 20 comprises a reset input terminal 1 connected to a first input of an NOR circuit 7, and a set input terminal 3 connected to the input of an inverter 9. The output of the NOR circuit 7 is connected to the Q output terminal 5 of the SR latch circuit 20 and also to the input of the inverter 9. The output of the inverter 9 is connected to the $\overline{Q}$ output terminal 6 of the SR latch circuit 20 and also to a second input of the NOR circuit 7. This SR latch circuit 20 employs the "1"-level-dominant wired logic (wired OR) configuration, and the relationship between the input logic levels and the output logic levels is as follows.

When $S=1$ and $R=0$, $Q=1$ and $\overline{Q}=0$;
when $S=0$ and $R=1$, $Q=0$ and $\overline{Q}=1$;
when $S=R=0$, a preceding state is held; and
when $S=R=1$, $Q=1$ and $\overline{Q}=0$.

Figure 2B:
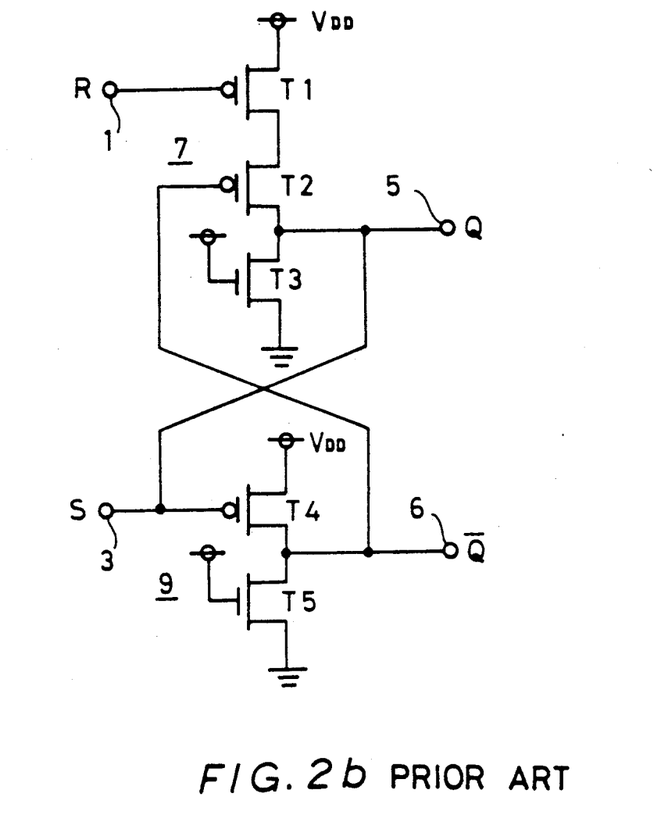

Regardless of the combination of the logic levels of the set and reset inputs S and R, the SR latch circuit 20 can provide complementary outputs, has no prohibited logic level combination, and has a simple configuration. Accordingly, this circuit 20 seems to have no problem. However, since the SR latch circuit 20 employs the wired OR configuration as stated above, its actual arrangement even in its simplest form must use a logic circuit configuration as shown in FIG. 2(b). In FIG. 2(b), the NOR 7 is formed by, for example, MOS P-channel transistors T1 and T2 and an MOS N-channel transistor T3 which are connected in series between a positive voltage source $V_{DD}$ and ground, and the inverter 9 is formed by, for example, an MOS P-channel transistor T4 and an MOS N-channel transistor T5 which are also connected in series between the positive voltage source $V_{DD}$ and ground. The MOS N-channel transistors T3 and T5 are biased to be always conductive as shown and act as pull-down resistors.

The following TABLE I shows the states of the respective transistors and the logic levels at the Q and $\overline{Q}$ output terminals 5 and 6 for various combinations of the logic levels applied to the set and reset input terminals 3 and 1 of the circuit of FIG. 2(b).

TABLE I

| S | R | T1 | T2 | T3 | T4 | T5 | $Q_n$ | $\overline{Q}_n$ |
|---|---|----|----|----|----|----|-------|------------------|
| 1 | 0 | ON | ON | ON | OFF | ON | 1 | 0 |
| 0 | 1 | OFF | OFF | ON | ON | ON | 0 | 1 |
| 1 | 1 | OFF | ON | ON | OFF | ON | 1 | 0 |
| 0 | 0 | ON | * | ON | * | ON | $Q_{n-1}$ | $\overline{Q}_{n-1}$ |

| *$Q_{n-1}$ | $\overline{Q}_{n-1}$ | T2 | T4 |
|---|---|---|---|
| 0 | 1 | OFF | ON |
| 1 | 0 | ON | OFF |

In this SR latch circuit, when $S=1$ and $R=0$, the transistors T1, T2 and T3 are conductive and, therefore, current flows through the NOR circuit 7, and when $S=0$ and $R=1$, the transistors T4 and T5 are conductive and, therefore, current flows in the inverter 9. Further, when $S=R=1$, current flows through either the NOR circuit 7 or the inverter 9. Accordingly, power consumed by the circuit as a whole is large and, therefore, this circuit may pose problems when it is used in a system which uses, as a power supply, a battery which is a capacity-limited power supply.

Figure 3A:
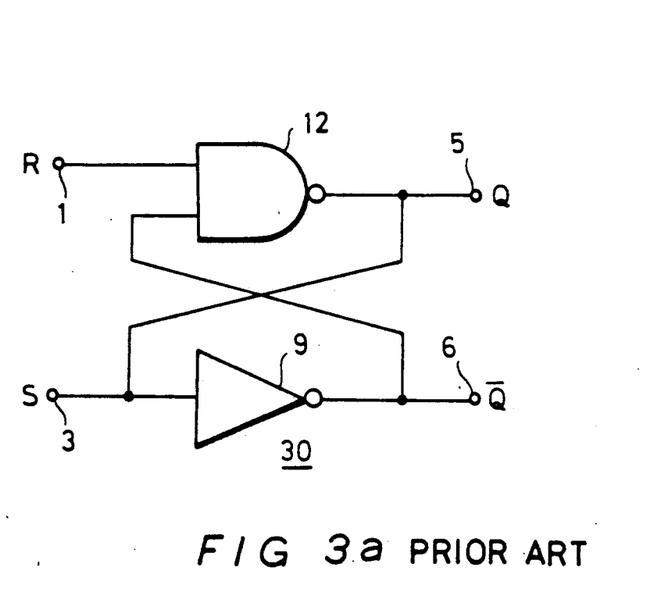

A second example of the SR latch circuits shown in the abovestated Japanese unexamined patent publication has a configuration as shown in FIG. 3(a). This SR latch circuit 30 has its reset input terminal 1 connected to a first input of an NAND circuit 12, and has its set input terminal 3 connected to the input terminal of an inverter 9. The output of the NAND circuit 12 is connected to the Q output terminal 5 of the SR latch circuit 30 and also to the input of the inverter 9. The output of the inverter 9 is connected to the $\overline{Q}$ output terminal 6 of the SR latch circuit 30 and also to a second input of the NAND circuit 12. This SR latch circuit 30 employs the "0"-level-dominant wired logic (wired AND) configuration, and the relationship between the input logic levels and the output logic levels is as follows.

When $S=1$ and $R=0$, $Q=1$ and $\overline{Q}=0$;
when $S=0$ and $R=1$, $Q=0$ and $\overline{Q}=1$;
when $S=R=1$, a preceding states is held; and
when $S=R=0$, $Q=0$ and $\overline{Q}=1$.

Figure 3B:
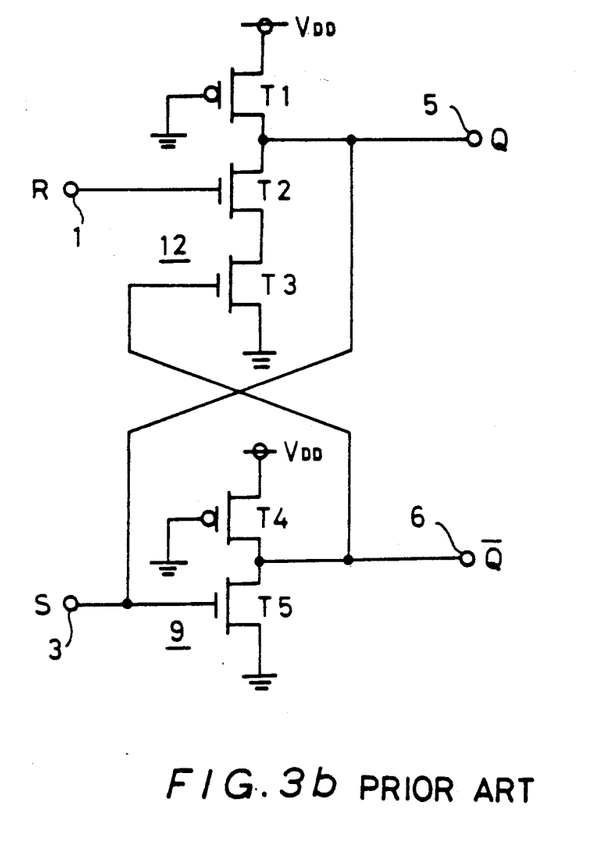

This SR latch circuit 30, too, can provide complementary outputs regardless of the combinations of the logic levels of the set input S and the reset input R. That is, there is no prohibited combination of the input signal logic levels. However, because this circuit 30 employs the wired AND configuration, its actual arrangement must employ a logic circuit configuration as shown in FIG. 3(b). In FIG. 3(b), for example, an MOS P-channel transistor T1 and MOS N-channel transistors T2 and T3 which are connected in series between a positive voltage source $V_{DD}$ and ground form the NAND circuit 12, and, for example, an MOS P-channel transistor T4 and an MOS N-channel transistor T5 connected in series between the positive voltage source $V_{DD}$ and ground form the inverter 9. As shown, the transistors T1 and T4 are biased to be always conductive and act as pull-up resistors.

The following TABLE II shows the states of the respective transistors and the logic levels of the outputs at the Q and $\overline{Q}$ output terminals 5 and 6 for various combinations of the logic levels applied to the set and reset input terminals 3 and 1 of the circuit 30 of FIG. 3(b).

TABLE II

| S | R | T1 | T2 | T3 | T4 | T5 | $Q_n$ | $\overline{Q}_n$ |
|---|---|----|----|----|----|----|-------|------------------|
| 1 | 0 | ON | OFF | OFF | ON | ON | 1 | 0 |
| 0 | 1 | ON | ON | ON | ON | OFF | 0 | 1 |
| 1 | 1 | ON | ON | * | ON | * | $Q_{n-1}$ | $\overline{Q}_{n-1}$ |
| 0 | 0 | ON | OFF | ON | ON | OFF | 0 | 1 |

| *$Q_{n-1}$ | $\overline{Q}_{n-1}$ | T3 | T5 |
|------------|----------------------|----|----|
| 0 | 1 | ON | OFF |
| 1 | 0 | OFF | ON |

Similar to the circuit of FIG. 2(b), when S=1 and R=0, when S=0 and R=1, and when S=R=1, current flows through either the inverter 9 or the NAND circuit 12. Accordingly, power consumed by the circuit 30 as a whole is large and, therefore, the circuit may pose problems when it is used in a system powered by a battery which is a capacity-limited power source.

The SR latch circuit according to the present invention operates in the same manner as the above-stated conventional SR latch circuits. That is, when S=1 and R=0, the latch circuit assumes a set state, and when S=0 and R=1, it assumes a reset state. When S=R=0, the SR latch circuit holds the preceding state. Furthermore, when S=R=1, the SR latch circuit according to the present invention can assume one of the set, reset and hold states, depending on the configuration of a logic circuit which is connected between data and sense inputs of a D-type latch and set and reset input terminals of the SR latch circuit. In addition, even when the input logic state changes from the state in which S=R=1 to the state S=R=0, the outputs Q and $\overline{Q}$ can be defined.

In contrast to the conventional SR latch circuits, in the SR latch circuit according to the present invention, currents which will flow through the logic circuit and the D-type latch are very small regardless of the combinations of the logic levels applied to the set and reset inputs S and R.

Figure 4A:
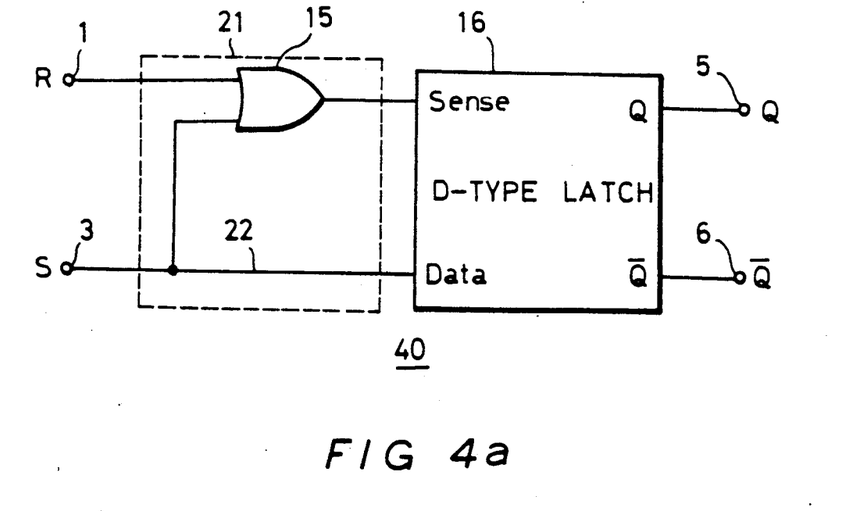
Figure 4B:
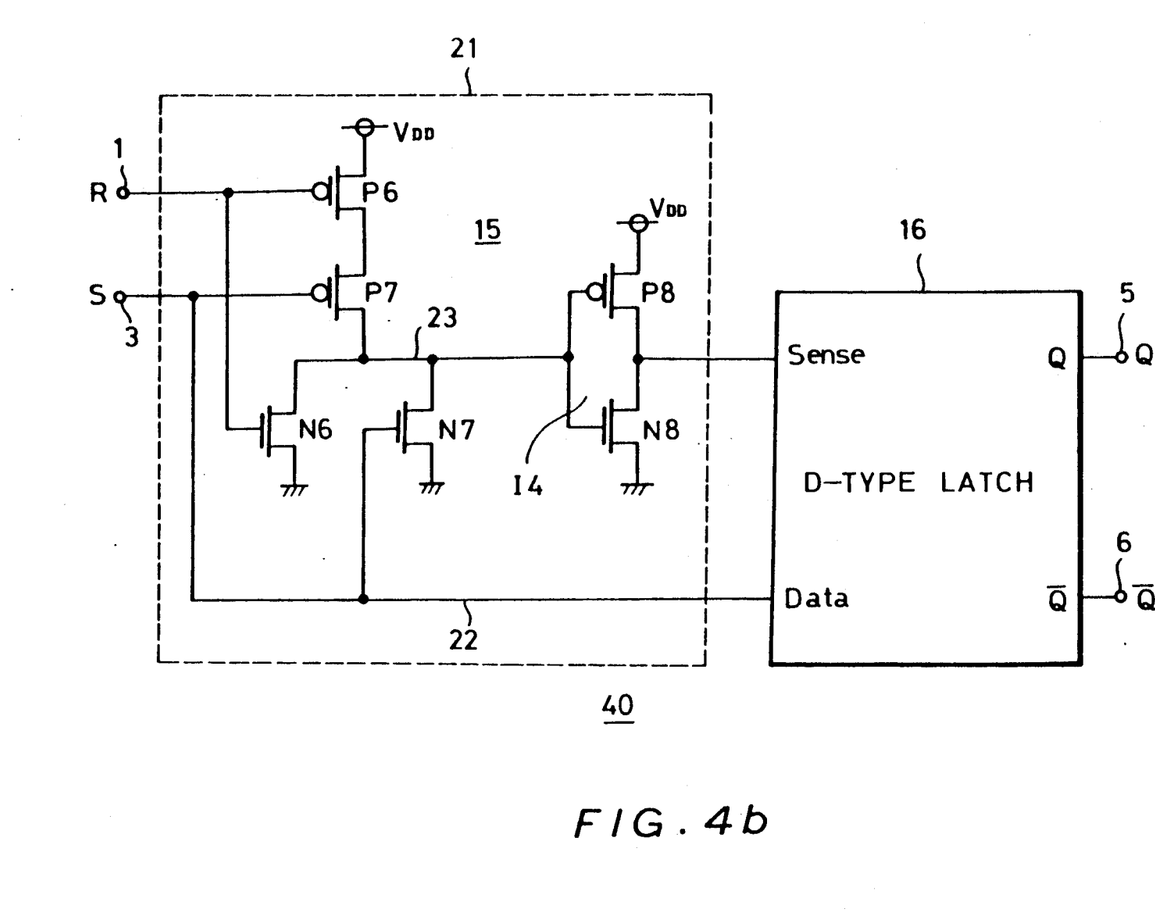
Figure 5A:
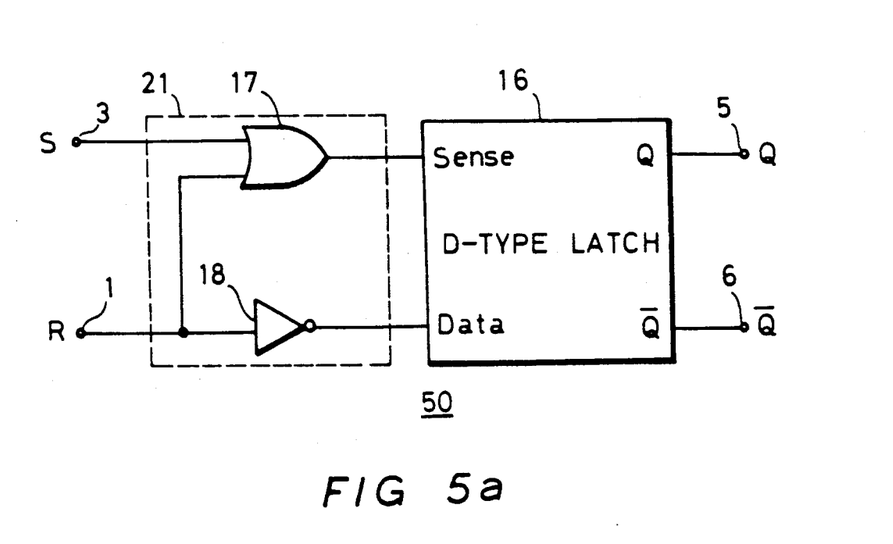
Figure 5B:
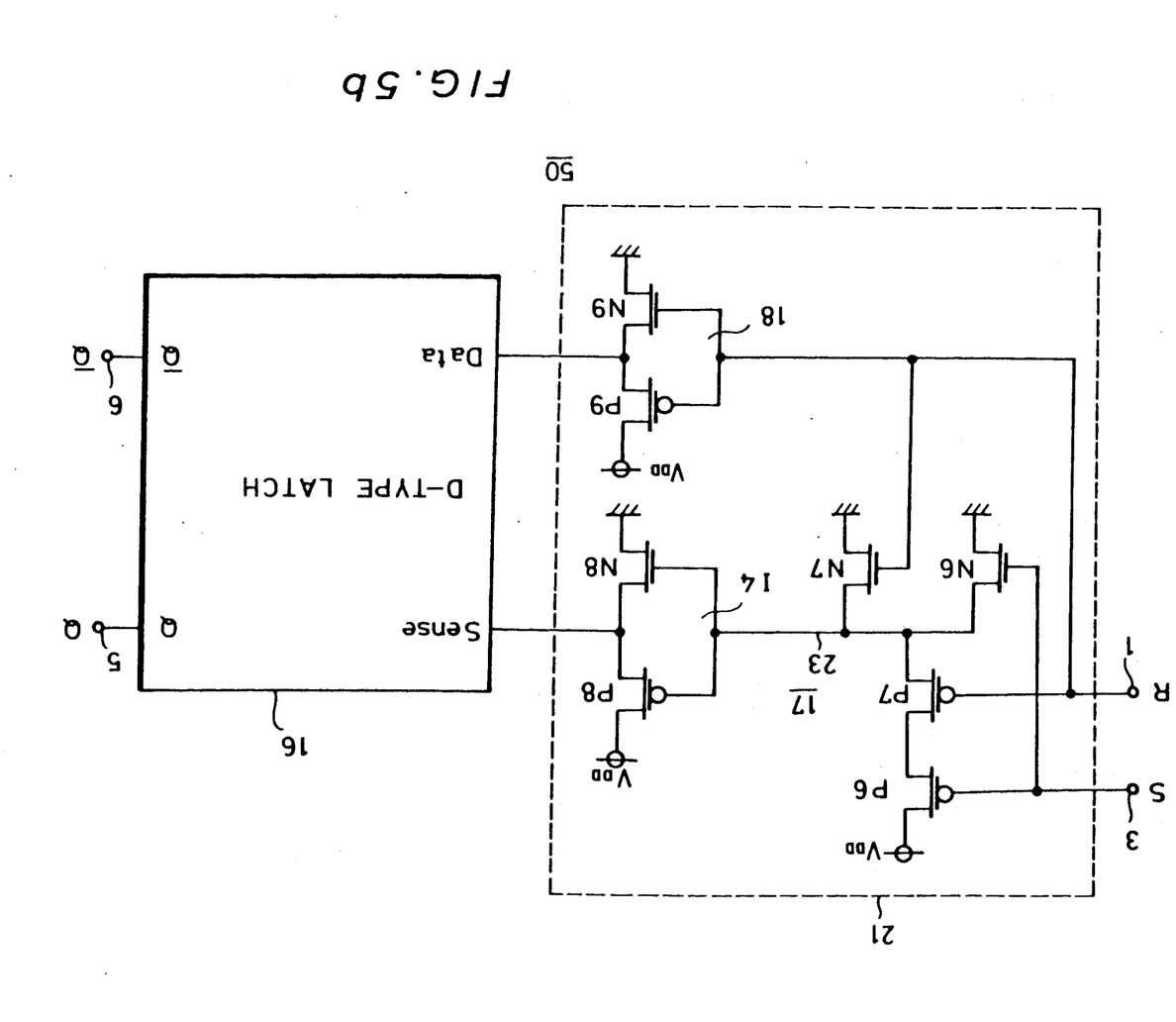
Figure 6A:
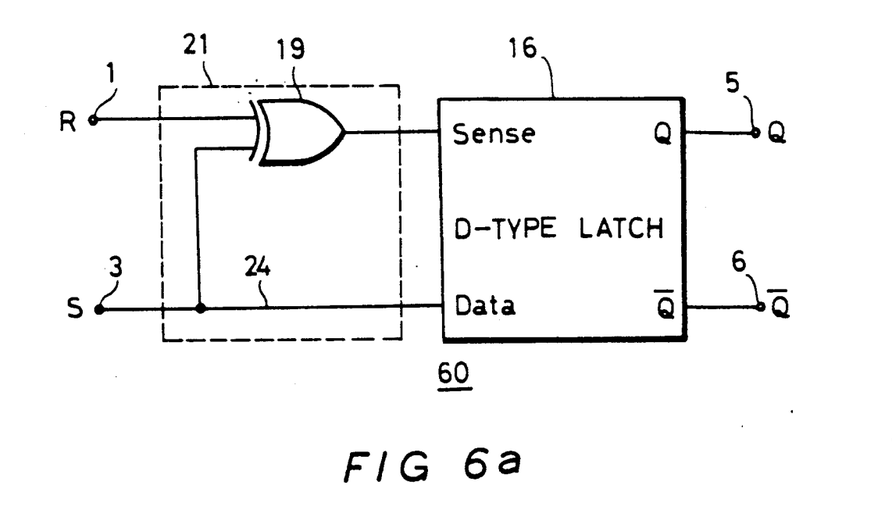
Figure 6B:
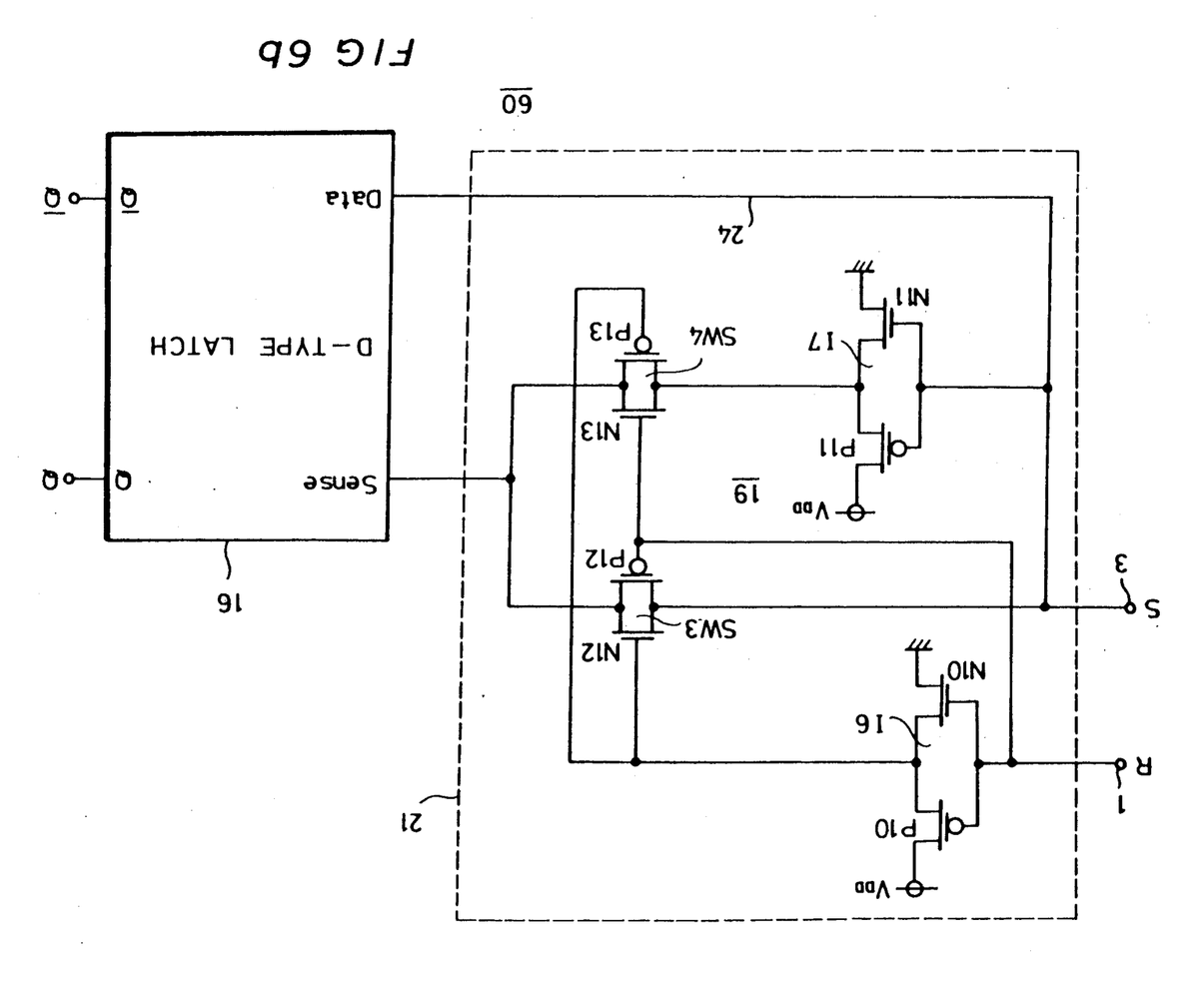
Figure 7:
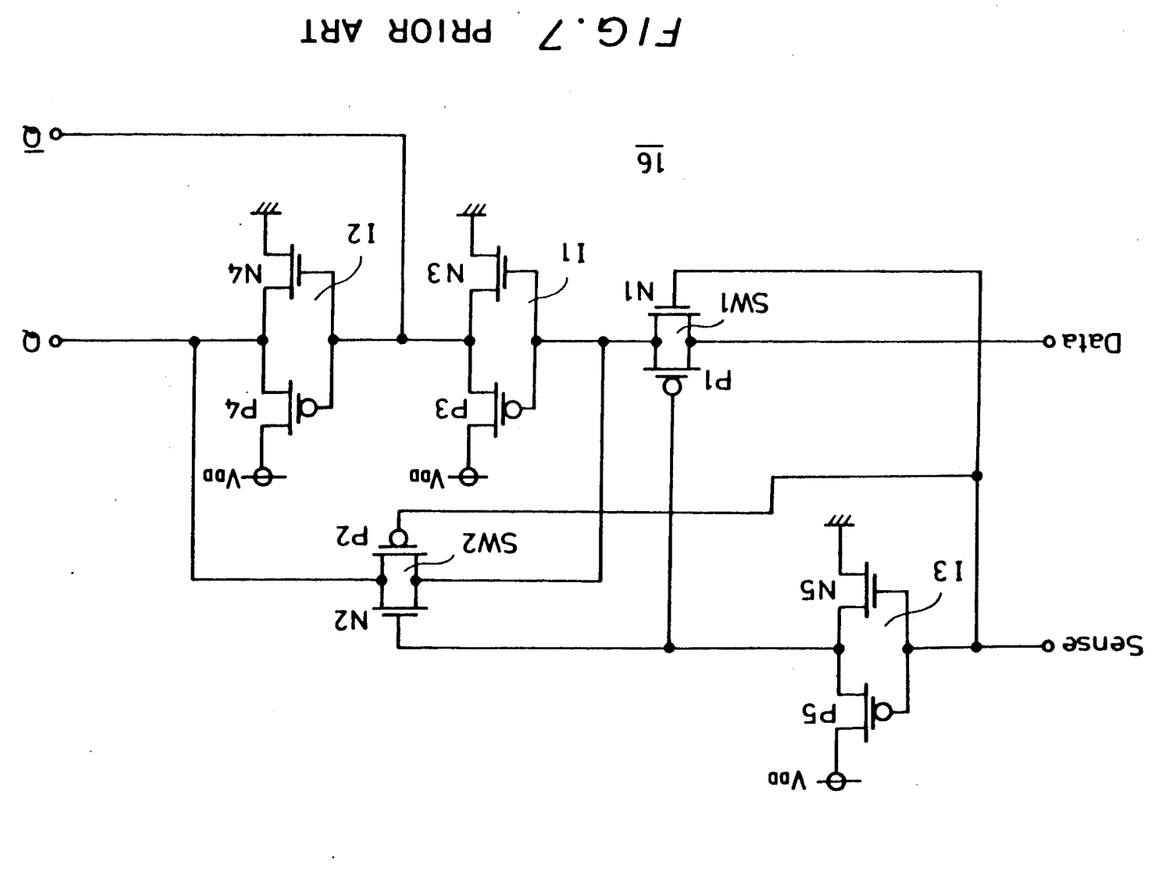
FIG. 7 is a circuit diagram of an example of a D-type latch which may be used in the SR latch circuits of the present invention.

Now, SR latch circuits according to the present invention are described in detail, with reference to FIGS. 4(a) and 4(b) which show a first embodiment of the invention, FIGS. 5(a) and 5(b) which show a second embodiment, FIGS. 6(a) and 6(b) which show a third embodiment, and FIG. 7 which shows a D-type latch that can be used as a part of the SR latch circuits of the present invention.

An SR latch circuit 40 according to the first embodiment of the present invention, shown in FIG. 4(a), comprises a D-type latch 16 having its Q output connected to a Q output terminal 5 of the SR latch circuit 40 and having its $\overline{Q}$ output connected to a $\overline{Q}$ output terminal 6 of the SR latch circuit 40, and a logic circuit 21 connected between a data input Data and a sense input Sense of the D-type latch 16, on one hand, and a reset input terminal 1 and a set input terminal 3 of the SR latch circuit 40, on the other hand. The logic circuit 21 comprises an OR circuit 15 having its first input connected to the reset input terminal 1, having its second input connected to the set input terminal 3, and having its output connected to the sense input Sense of the D-type latch 16, and a line 22 which connects the set input terminal 3 to the data input Data of the D-type latch 16.

The SR latch circuits of the present invention use a conventional D-type latch 16. This D-type latch 16 has a circuit configuration such as shown in FIG. 7. In FIG. 7, a first switch SW1 comprises, for example, an MOS P-channel transistor P1 and an MOS N-channel transistor N1, and, similarly, a second switch SW2 comprises an MOS P-channel transistor P2 and an N-channel transistor N2. A first inverter I1 is of a CMOS configuration which comprises a P-channel transistor P3 and an N-channel transistor N3 that are connected in series between a positive voltage source $V_{DD}$ and ground. Similarly, a second inverter I2 is of a CMOS configuration which comprises a P-channel transistor P4 and an N-channel transistor N4 that are connected in series between the positive voltage source $V_{DD}$ and ground. There is a third inverter I3 which is also of a CMOS configuration comprising a P-channel transistor P5 and an N-channel transistor N5 that are connected in series between the positive voltage source $V_{DD}$ and ground. In this D-type latch 16, when the signal at the sense input Sense is 1, the transistors P1 and N1 of the first switch SW1 are both conductive and, hence, the first switch SW1 is conductive, whereas both transistors P2 and N2 of the second switch SW2 are non-conductive and, therefore, the second switch SW2 is turned off. Consequently, the input signal applied to the data input Data appears as it is at the Q output, whereas the inverted version of the input signal applied to the data input Data, that is, a signal complementary to the signal at the Q output is developed at the $\overline{Q}$ output. When the signal at the sense input Sense is 0, the switch SW1 is turned off and the switch SW2 is turned on, and, therefore, the immediately preceding data input is held as it is.

A logic circuit configuration such as shown in FIG. 4(b) may be used as the logic circuit 21 of the SR latch circuit of FIG. 4(a). In the logic circuit 21 shown in FIG. 4(b), MOS P-channel transistors P6 and P7, for example, are connected in series between a positive voltage source $V_{DD}$ and a line 23, and, similarly, MOS N-channel transistors N6 and N7 are connected in parallel with each other between the line 23 and ground. The reset input terminal 1 of the SR latch circuit 40 is connected to the gates of the transistors P6 and N6, while the set input terminal 3 of the SR latch circuit 40 is connected to the gates of the transistors P7 and N7 and also connected directly to the data input Data of the D-type latch 16 via a line 22. The line 23 is connected to an inverter I4 formed of a CMOS device which comprises a P-channel transistor P8 and an N-channel transistor N8 that are connected in series between the positive voltage source $V_{DD}$ and ground. The output of the inverter I4 is connected to the sense input Sense of the D-type latch 16.

In the SR latch circuit 40 shown in FIG. 4(b), the P-channel transistors P6 and P7, the N-channel transistors N6 and N7 and the inverter I4 of the logic circuit 21 act together as an OR circuit 15 for signals applied to the set and reset inputs of the SR latch circuit 40. Specifically, when a signal S at the set input is 1 (S=1) and a signal at the reset input R is 0 (R=0), the transistors P6 and N7 are conductive, the transistors P7 and N6 are non-conductive and, therefore, the signal on the line 23 and, hence, the input to the inverter I4 is 0. Then, the output of the inverter I4 or the signal applied to the sense input Sense of the D-type latch 16 is 1. At this time, the signal applied to the data input Data is 1. Consequently, the Q output is 1 and the $\overline{Q}$ output is 0. That is, the SR latch circuit 40 is placed in the set state.

When S=0 and R=1, the transistors P7 and N6 are conductive and the transistors P6 and N7 are non-conductive, so that the signal on the line 23 and, hence, the input to the inverter I4 is 0. Accordingly, the output of the inverter I4 and, hence, the signal to the sense input Sense of the D-type latch 16 is 1. Since the signal to the data input Data is 0, the Q output and the $\bar{Q}$ output are 0 and 1, respectively. In other words, the SR latch circuit 40 is placed in the reset state.

When $S=R=0$, the transistors P6 and P7 are conductive, while the transistors N6 and N7 are non-conductive, so that the input to the inverter IN4 is 1 and, therefore, the output from the inverter IN4 and, hence, the input to the sense input Sense of the D-type latch 16 is 0. Consequently, in this case, regardless of the logic level of the set input S, the D-type latch 16 holds its preceding state, and, therefore, the SR latch circuit is placed in the hold state.

When $S=R=1$, the transistors P6 and P7 are non-conductive and the transistors N6 and N7 are conductive so that the input to the inverter IN4 is 0. Accordingly, the output from the inverter IN4 and, hence, the input to the sense input Sense of the D-type latch 16 is 1. Since the input to the data input Data is 1, the Q output is 1 and the $\bar{Q}$ output is 0, and, therefore, the SR latch circuit 40 is placed in the set state.

Thus, the SR latch circuit 40 of FIG. 4(b) is a set-dominant SR latch circuit which is placed in the set state when $S=R=1$. When the input logic level state changes from this $S=R=1$ state to the state $S=R=0$, the SR latch circuit 40 assumes the hold state, because the input to the sense input Sense of the D-type latch 16 is 0, and, therefore, the state of the SR latch circuit 40 can be thus defined. In the SR latch circuit 40 according to the first embodiment of the present invention, whatever the combination of the logic levels of the inputs S and R at the set and reset input terminals is, no current flows between the positive voltage source $V_{DD}$ and ground in a static condition. Thus, power consumed by the circuit is very small.

FIGS. 5(a) and 5(b) show an SR latch circuit 50 according to the second embodiment of the present invention. As shown in FIG. 5(a), the logic circuit 21 used in the SR latch circuit 50 is connected between the D-type latch 16 on one hand and the set and reset input terminals 3 and 1, and comprises an OR circuit 17 having its first input connected to the set input terminal 3, having its second input connected to the reset input terminal 1, and having its output connected to the sense input Sense of the D-type latch 16, and an inverter 18 having its input connected to the reset input terminal 1 and having its output connected to the data input Data of the D-type latch 16.

A circuit configuration as shown in FIG. 5(b) may be used for the logic circuit 21 of the SR latch circuit of FIG. 5(a). The logic circuit 21 shown in FIG. 5(b) comprises an OR circuit 17 and an inverter 18. The OR circuit 17 comprises MOS P-channel transistors P6 and P7 which are connected between a positive voltage source $V_{DD}$ and a line 23, MOS N-channel transistors N6 and N7 which are connected between the line 23 and ground, and an inverter I4 comprising a CMOS device connected between the positive voltage source $V_{DD}$ and ground. The inverter 18 is connected between the reset input terminal 1 of the SR latch circuit 50 and the data input Data of the D-type latch 16. Like the inverter I4, the inverter 18 is formed of a CMOS device which comprises a P-channel transistor P9 and an N-channel transistor N9 that are connected in series between the positive voltage source $V_{DD}$ and ground.

In the SR latch circuit 50 according to the second embodiment, when $S=1$ and $R=0$, the transistor P6 is non-conductive and the transistor N6 is conductive. Therefore, the input to the inverter I4 is 0 so that its output is 1, which is applied to the sense input Sense of the D-type latch 16. The input to the inverter 18 is 0, so that it provides 1 to the data input Data of the D-type latch 16. This causes 1 and 0 to be developed at the Q and $\bar{Q}$ output terminals of the SR latch circuit 50, respectively, and, thus, the SR latch circuit 50 assumes the set state.

When $S=0$ and $R=1$, the transistor P7 is non-conductive and the transistor N7 is conductive so that the input to the inverter I4 is 0. Thus, the inverter I4 provides 1, which is coupled to the sense input Sense of the D-type latch 16. The input to the inverter 18 is 1 so that its output is 0, which 0 is applied to the data input Data of the D-type latch 16. Then, the outputs at the Q and $\bar{Q}$ output terminals of the SR latch circuit 50 are 0 and 1, respectively. Thus, the SR latch circuit 50 assumes the reset state.

When $S=R=0$, the transistors P6 and P7 are conductive, while the transistors N6 and N7 are non-conductive. Then, the input to the inverter I4 is 1. The output 0 of the inverter I4 is applied to the sense input Sense of the D-type latch 16. Thus, the SR latch circuit 50 assumes the hold state in which it holds the immediately preceding state.

When $S=R=1$, the transistors P6 and P7 are non-conductive and the transistors N6 and N7 are conductive so that the input to the inverter I4 is 0 and its output is 1. Thus, the input to the sense input Sense of the D-type latch 16 is 1. The input to the inverter 18 is 1 so that its output is 0, which 0 is applied to the data input Data of the D-type latch 16. Then, the outputs at the Q and $\bar{Q}$ output terminals of the SR latch circuit 50 are 0 and 1, respectively. Thus, the SR latch circuit 50 assumes the reset state.

Thus, the SR latch circuit 50 according to the second embodiment of the present invention shown in FIG. 5(b) is a reset-dominant SR latch circuit which assumes the reset state when $S=R=1$. When the input state changes from $S=R=1$ to $S=R=0$, the SR latch circuit 50 assumes the hold state stated above, i.e. the state of the SR latch circuit 50 can be thus defined.

In the SR latch circuit 50 of the second embodiment, as in the SR latch circuit 40 of the first embodiment shown in FIG. 4(b), no current flows in a static condition between the voltage source $V_{DD}$ and ground whatever combination the logic levels of the set and reset inputs S and R assume, and, accordingly, the power consumed by this SR latch circuit 50 is very small.

FIGS. 6(a) and 6(b) show an SR latch circuit 60 according to the third embodiment of the present invention. As shown in FIG. 6(a), the logic circuit 21 connected between the D-type latch 16 and the set and reset input terminals 3 and 1 comprises an EXOR circuit 19 and a line 24 which connects the set input terminal 3 to the data input Data of the D-type latch 16. The EXOR circuit 19 has its first input connected to the reset input terminal 1, having its second input connected to the set input terminal 3, and having its output connected to the sense input Sense of the D-type latch 16.

A circuit configuration such as shown in FIG. 6(b) may be used for the logic circuit 21 of the SR latch circuit of FIG. 6(a). In FIG. 6(b), the reset input terminal 1 is connected to an input of an inverter I6 comprising a CMOS device which comprises a P-channel transistor P10 and an N-channel transistor N10 that are connected in series between a positive voltage source $V_{DD}$ and ground. The reset input terminal 1 is also connected to the gate of an MOS P-channel transistor P12 of a switch SW3 and also to the gate of an MOS N-channel transistor N13 of a switch SW4. The output of the inverter I6 is coupled to the gate of an MOS N-channel transistor N12 of the switch SW3 and also to the gate of an MOS P-channel transistor P13 of the switch SW4. The set input terminal 3 of the SR latch circuit 60 is coupled through the switch SW3 to the sense input Sense of the D-type latch 16 and also directly to the data input Data of the D-type latch 16 by a line 24. The set input terminal 3 is further connected to the input of an inverter I7 formed by a CMOS device comprising a P-channel transistor P11 and an N-channel transistor N11 which are connected in series between the positive voltage source $V_{DD}$ and ground. The output of the inverter I7 is coupled through the switch SW4 to the sense input Sense of the D-type latch 16. The inverters I6 and I7 and the switches SW3 and SW4 of the logic circuit 21 shown in FIG. 6(b) cooperate to serve as an exclusive OR (EXOR) circuit 19 for inputs R and S at the reset and set input terminals 1 and 3, respectively.

In the SR latch circuit 60 according to the third embodiment of the present invention shown in FIG. 6(b), when S=1 and R=0, the output of the inverter I6 is 1 so that the switch SW3 is turned on and the switch SW4 is turned off and, therefore, the set input S=1 is applied through the switch SW3 to the sense input Sense of the D-type latch 16. Since the input to the data input Data of the D-type latch 16 is also 1, the outputs at the Q and $\bar{Q}$ output terminals of the SR latch circuit 60 are 1 and 0, respectively. Thus, the SR latch circuit 60 is placed in the set state.

When S=0 and R=1, the switch SW3 is turned off and the switch SW4 is turned on so that the output 1 of the inverter I7 is coupled through the switch SW4 to the sense input Sense of the D-type latch 16. Since the input to the data input Data of the D-type latch 16 is 0, the outputs at the Q and $\bar{Q}$ output terminals of the SR latch circuit 60 are 0 and 1, respectively, and, therefore, the SR latch circuit 60 assumes the reset state.

When S=R=0, the switch SW3 is turned on and the switch SW4 is turned off, so that the set input S=0 is coupled through the switch SW3 to the sense input Sense of the D-type latch 16. Thus, the D-type latch 16, regardless of the logic level at its data input Data, holds its immediately preceding state. Thus, the SR latch circuit 60 assumes the hold state.

When S=R=1, the switch SW3 is turned off and the switch SW4 is turned on, so the output 0 from the inverter I7 is coupled through the switch SW4 to the sense input Sense of the D-type latch 16. Then, the D-type latch 16 retains its immediately preceding state regardless of the logic level at the data input Data of the D-type latch 16. Thus, the SR latch circuit 60 assumed the hold state.

When the input state S=R=1 changes to S=R=0, the state of the SR latch circuit 60 can be defined as being the hold state.

In this SR latch circuit 60 according to the third embodiment of the present invention shown in FIG. 6(b), as in the SR latch circuits of the first and second embodiments, no current flows in its static condition between the voltage source $V_{DD}$ and ground whatever combination the logic levels of the set and reset inputs S and R assume. Accordingly, the power consumption of this SR latch circuit 60 is very small, too.

As stated above, the SR latch circuit of the present invention can be formed by simply adding to a conventional D-type latch, a simple-structured logic circuit which comprises an OR circuit, an OR circuit and an inverter, or an EXOR circuit, and it can provide complementary outputs whatsoever the combination of the logic levels at its set and reset input terminals is. Furthermore, the SR latch circuit according to the present invention can operate as a set-dominant SR latch circuit or a reset-dominant SR latch circuit, in which, when the set input S=1 and the reset input R=1, the circuit can assume the set or reset state, or it can operate as an SR latch circuit which can hold its preceding state when both S and R become 1. Furthermore, the SR latch circuit according to the present invention can have a defined state even when its input state changes from S=R=1 to S=R=0.

In addition, because, in the SR latch circuit according to the present invention, only an inverter or inverters each comprising a CMOS device are connected between the positive voltage source $V_{DD}$ and ground in either of the D-type latch and the logic circuit used in the SR latch circuit, current flows only when the logic levels change and no current flows in the static condition. Accordingly, the amount of power consumed by the SR latch circuit according to the present invention is reduced to about 1/6 or about 1/7 that of the conventional SR latch circuits shown in FIGS. 2(b) and 3(b).

Simulation was conducted by the inventors under the following conditions, for measuring operating currents of the SR latch circuits according to the present invention shown in FIGS. 4(b), 5(b) and 6(b) and the conventional SR latch circuits shown in FIGS. 2(b) and 3(b). The voltage of the positive voltage source $V_{DD}$ was 5 V (volts). The ambient temperature was maintained at 27° C. A pulse having rising and falling times each of 2ns (nanoseconds), a period of 50 ns and a duty cycle of 50% was applied to the set input terminal of each circuit. A pulse having rising and falling times each of 2 ns, a period of 100 ns and a duty cycle of 50% was applied to the reset input terminal. The operating currents were measured each nanosecond from the beginning of the simulation for 1000 nanoseconds. The results are as follows.

| | Operating Current of SR Latch Circuit (mA) | | | | |
|---|---|---|---|---|---|
| Time (ns) | Circuit of FIG. 4(b) | Circuit of FIG. 5(b) | Circuit of FIG. 6(b) | Circuit of FIG. 2(b) (Prior Art) | Circuit of FIG. 3(b) (Prior Art) |
| . | . | . | . | . | . |
| . | . | . | . | . | . |
| 967 | 0.05470 | 0.05443 | 0.05684 | 0.3082 | 0.3513 |
| 968 | 0.05463 | 0.05678 | 0.05678 | 0.3083 | 0.3510 |
| 969 | 0.05457 | 0.05445 | 0.05672 | 0.3083 | 0.3506 |
| 970 | 0.05450 | 0.05440 | 0.05666 | 0.3084 | 0.3503 |
| 971 | 0.05444 | 0.05436 | 0.05660 | 0.3085 | 0.3499 |
| 972 | 0.05439 | 0.05430 | 0.05654 | 0.3085 | 0.3495 |
| 973 | 0.05434 | 0.05423 | 0.05648 | 0.3086 | 0.3492 |
| 974 | 0.05430 | 0.05413 | 0.05643 | 0.3087 | 0.3488 |
| 975 | 0.05426 | 0.05402 | 0.05637 | 0.3087 | 0.3484 |
| 976 | 0.05433 | 0.05404 | 0.05643 | 0.3087 | 0.3485 |
| 977 | 0.05504 | 0.05466 | 0.05700 | 0.3087 | 0.3486 |
| 978 | 0.05561 | 0.05518 | 0.05751 | 0.3087 | 0.3485 |
| 979 | 0.05550 | 0.05514 | 0.05750 | 0.3088 | 0.3487 |
| 980 | 0.05544 | 0.05508 | 0.05744 | 0.3089 | 0.3488 |
| 981 | 0.05539 | 0.05502 | 0.05737 | 0.3089 | 0.3489 |

-continued

| | Operating Current of SR Latch Circuit (mA) | | | | |
|---|---|---|---|---|---|
| Time (ns) | Circuit of FIG. 4(b) | Circuit of FIG. 5(b) | Circuit of FIG. 6(b) | Circuit of FIG. 2(b) (Prior Art) | Circuit of FIG. 3(b) (Prior Art) |
| 982 | 0.05529 | 0.05495 | 0.05731 | 0.3090 | 0.3490 |
| 983 | 0.05522 | 0.05490 | 0.05727 | 0.3090 | 0.3491 |
| 984 | 0.05518 | 0.05486 | 0.05723 | 0.3091 | 0.3492 |
| 985 | 0.05517 | 0.05481 | 0.05717 | 0.3092 | 0.3493 |
| 986 | 0.05516 | 0.05476 | 0.05710 | 0.3092 | 0.3494 |
| 987 | 0.05513 | 0.05470 | 0.05702 | 0.3093 | 0.3495 |
| 988 | 0.05507 | 0.05464 | 0.05693 | 0.3093 | 0.3496 |
| 989 | 0.05500 | 0.05457 | 0.05686 | 0.3094 | 0.3497 |
| 990 | 0.05491 | 0.05449 | 0.05679 | 0.3095 | 0.3498 |
| 991 | 0.05480 | 0.05443 | 0.05673 | 0.3095 | 0.3499 |
| 992 | 0.05469 | 0.05436 | 0.05668 | 0.3096 | 0.3500 |
| 993 | 0.05460 | 0.05430 | 0.05663 | 0.3096 | 0.3501 |
| 994 | 0.05452 | 0.05424 | 0.05659 | 0.3097 | 0.3502 |
| 995 | 0.05445 | 0.05419 | 0.05656 | 0.3098 | 0.3503 |
| 996 | 0.05440 | 0.05414 | 0.05653 | 0.3098 | 0.3504 |
| 997 | 0.05435 | 0.05409 | 0.05648 | 0.3099 | 0.3505 |
| 998 | 0.05433 | 0.05405 | 0.05643 | 0.3099 | 0.3506 |
| 999 | 0.05431 | 0.05401 | 0.05636 | 0.3100 | 0.3507 |
| 1000 | 0.05431 | 0.05396 | 0.05628 | 0.3101 | 0.3508 |

From this data it is seen that the average operating current of the first embodiment of the present invention shown in FIG. 4(b) is about 0.054 mA, that of the second embodiment shown in FIG. 5(b) is about 0.054 mA, and that of the third embodiment shown in FIG. 6(b) is about 0.056 mA. In contrast, the average operating currents of the conventional SR latch circuits shown in FIGS. 2(b) and 3(b) are about 0.31 mA and 0.35 mA, respectively. Thus, the current consumed and, hence, the power consumed by the SR latch circuits of the present invention are about 1/6 to 1/7 that of the conventional SR latch circuits. Accordingly, the SR latch circuit of the present invention can be used advantageously in systems powered by batteries which are limited in capacity.

What is claimed is:

1. An SR latch circuit, comprising:
   a D-type latch having data and sense inputs and Q and $\overline{Q}$ outputs, said Q and $\overline{Q}$ outputs being connected to Q and $\overline{Q}$ output terminals of said SR latch circuit; and
   a logic circuit connected between said inputs of said D-type latch and set and reset input terminals of said SR latch circuit;
   wherein, when signals applied to said set and reset input terminals are expressed as S and R, said logic circuit establishes logic levels of signals applied to said data and sense inputs of said D-type latch such that said SR latch circuit is placed in a set state when S=1 and R=0, said SR latch circuit is placed in a reset state when S=0 and R=1, said SR latch circuit is placed in a hold state when S=R=0, and said SR latch circuit is placed in a predetermined one of said set, reset and hold states when S=R=1.

2. An SR latch circuit according to claim 1, wherein said D-type latch comprises a first switch rendered conductive when the logic level of a signal at said sense input is 1, a second switch rendered conductive when the logic level of a signal at said sense input is 0, and first and second inverters each comprising a CMOS device; said first switch and said first and second inverters are connected in series between said data input and said Q output; said second switch is connected between the input of said first inverter and the output of said second inverter; and the output of said first inverter is connected to the $\overline{Q}$ output; whereby substantially no current flows in said D-type latch in a static condition.

3. An SR latch circuit according to claim 1, wherein said logic circuit comprises an OR circuit having its first input connected to said reset input terminal, having its second input connected to said set input terminal and having its output terminal connected to said sense input of said D-type latch, and a line connecting said set input terminal to said data input of said D-type latch.

4. An SR latch circuit according to claim 3, wherein said OR circuit comprises an inverter comprising a CMOS device and having its output connected to the sense input of said D-type latch, first and second MOS transistors of first conductivity type connected in series between the input of said inverter and one terminal of a voltage source, and third and fourth MOS transistors of second conductivity type connected in parallel between the input of said inverter and the other terminal of said voltage source; the gates of said first and third transistors are connected to said reset input terminal and the gates of said second and fourth transistors are connected to said set input terminal; and said set input terminal is connected directly to the data input of said D-type latch; whereby substantially no current flows in said logic circuit in a static condition.

5. An SR latch circuit according to claim 1, wherein said logic circuit comprises an OR circuit having its first input connected to said set input terminal, having its second input connected to said reset input terminal and having its output connected to said sense input of said D-type latch, and an inverter having its input connected to said reset input terminal and having its output connected to said data input of said D-type latch.

6. An SR latch circuit according to claim 5, wherein said OR circuit comprises a first inverter comprising a CMOS device and having its output connected to the sense input of said D-type latch, first and second MOS transistors of first conductivity type connected in series between the input of said inverter and one terminal of a voltage source, and third and fourth MOS transistors of second conductivity type connected in parallel between the input of said inverter and the other terminal of said voltage source; the gates of said first and third transistors are connected to said set input terminal and the gates of said second and fourth transistors are connected to said reset input terminal; and said reset input terminal is further connected to the data input of said D-type latch through a second inverter comprising a CMOS device; whereby substantially no current flows in said logic circuit in a static condition.

7. An SR latch circuit according to claim 1, wherein said logic circuit comprises an EXOR circuit having its first input connected to said reset input terminal, having its second input connected to said set input terminal and having its output connected to said sense input of said D-type latch, and a line connecting said set input terminal to said data input of said D-type latch.

8. An SR latch circuit according to claim 7, wherein said EXOR circuit comprises a first switch rendered conductive when a signal at said reset input terminal is 1, a second switch rendered conductive when a signal at said reset input terminal is 0, and an inverter comprising a CMOS device and having its input connected to said set input terminal and having its output connected to the input of said first switch; said set input terminal is connected to the input of said first switch and also directly to the data input of said D-type latch; and the outputs of said first and second switches are connected to the sense input of said D-type latch; whereby substantially no current flows in said logic circuit in a static condition.

9. An SR latch circuit, comprising:
a D-type latch;
said D-type latch having a set and a reset state;
said D-type latch including means for substantially blocking passage of current from a DC supply in both its set and its reset states;
a logic circuit connected to inputs of said D-type latch;
said logic circuit having a sense input of said SR latch circuit and a data input of said SR latch circuit;
said logic circuit including means for substantially blocking passage of current from a DC supply in all quiescent states;
said logic circuit including means for producing a set state when said set input is 1 and said reset input is 0, and means for producing a reset state when said set input is 0 and said reset input is 1, means for producing a hold state when said set input is 0 and said reset input is 0, and means for producing a predetermined one of a set, a reset and a hold state when said set input is 1 and said reset input is 1.

10. An SR latch circuit according to claim 9, wherein said logic circuit is a CMOS device.

11. An SR latch circuit according to claim 9, wherein:
said logic circuit includes an OR circuit receiving said set and reset inputs;
an output of said OR circuit is connected to said sense input; and
said reset input is connected to said data input.

12. An SR latch circuit according to claim 9, wherein:
said logic circuit includes an XOR gate;
said XOR gate receiving said set and reset inputs;
an output of said XOR gate is connected to said sense input; and
said set input is connected to said data input.

13. An SR latch circuit according to claim 9, wherein:
said logic circuit includes an NOR gate receiving said set and reset inputs;
an output of said NOR gate is connected to said sense input;
said logic circuit further includes an inverter receiving said reset input; and
an output of said inverter is connected to said data input.

14. An SR latch circuit, comprising:
a D-type latch;
said D-type latch being CMOS;
a logic circuit at an input to said D-type latch;
said logic circuit being CMOS;
said logic circuit including logic means which, in combination with said D-type latch, produce said SR latch circuit; and
means for preventing the occurrence of an ambiguous state in said SR latch circuit under any condition of inputs.

15. An SR latch circuit, according to claim 14, wherein:
said logic means includes at least one of an AND gate, an OR gate, and an XOR gate.

* * * * *